United States Patent [19]

Otao

[11] 4,334,197

[45] Jun. 8, 1982

[54] POWER AMPLIFIER CIRCUITRY

[75] Inventor: Kazumasa Otao, Tokyo, Japan

[73] Assignee: Trio Kabushiki Kaisha, Tokyo, Japan

[21] Appl. No.: 158,893

[22] Filed: Jun. 12, 1980

[30] Foreign Application Priority Data

Jun. 18, 1979 [JP] Japan .................. 54-76423
Jun. 21, 1979 [JP] Japan .................. 54-85217
Jun. 21, 1979 [JP] Japan .................. 54-85218

[51] Int. Cl.³ .............................................. H03F 3/30
[52] U.S. Cl. .................................................. 330/268
[58] Field of Search ................. 330/265, 268, 270, 274

[56] References Cited

U.S. PATENT DOCUMENTS 3,883,813  5/1975  Sekiya .................. 330/268

Primary Examiner—James B. Mullins
Attorney, Agent, or Firm—Gerald J. Ferguson, Jr.; Joseph J. Baker

[57] ABSTRACT

A single-ended, push-pull, power amplifier circuit where switching distortion due to transistors and diodes is lessened.

5 Claims, 6 Drawing Figures

POWER AMPLIFIER CIRCUITRY

BACKGROUND AND OBJECTS OF THE INVENTION

This invention is directed to power amplifying circuitry.

Single-ended, push-pull (abbreviated SEPP hereafter) power amplifying circuitry, especially Class-B SEPP power amplifier circuitry has frequently been used for audio power amplification. In particular, a Class-B SEPP power amplifier circuit has been used which passes a fixed idling current for effective power efficiency, but is biased to perform Class-B operation.

Class-B, SEPP power amplifier circuitry tends to develop switching distortion during the switching of the transistors, this being attributable to the carrier storage effect of the transistors. Therefore, there has been employed a power amplifier circuit as shown in FIG. 1, in which a diode 5 is connected between the emitter of a transistor 1 and the collector of a transistor 3 to form an inverted Darlington connection between the transistors. The collector of transistor 3 is connected to a load 7 through a resistor 6. Further, a diode 8 is connected between the emitter of a transistor 2 and the collector of a transistor 4 to form an inverted Darlington connection between transistors 2 and 4. The collector of transistor 4 is connected to load 7 through a resistor 9. A fixed voltage, bias circuit 11 is connected between the bases of transistors 1 and 2. The foregoing elements comprise the prior art SEPP power amplifier circuit where resistor 10 is connected between the emitters of transistors 1 and 2.

When the positive half cycle of an input signal is applied, transistors 1, 2, 3, and 4 are not turned off at the no-input signal level thereof nor are they turned off at the no-input signal level when the negative half cycle is applied. When the positive half cycle is being applied, transistors 1 and 3 supply power to the load and when the negative half cycle is being applied, transistors 2 and 4 supply power to the load, and operate at virtually the same power efficiency as Class-B operation. Thus, since transistors 1, 2, 3, and 4 are not turned on and off, switching distortion due to the switching of transistors does not occur.

However, diodes 5 and 8, on the other hand, are respectively turned off during the negative and positive half cycles of the input signal. Thus, the switching currents of diodes 5 and 8, that flow in the opposite direction of the diodes due to the carrier storage effect of the diodes (for example, when the negative half cycle of the input signal changes to the positive half cycle, as shown by the arrow A in FIG. 1), flow to transistors 1 and 2 and are amplified by transistors 3 and 4. Switching distortion due to the diodes results.

Thus, one object of this invention is to eliminate the above-mentioned shortcoming and to provide improved power amplifier circuitry that operates at virtually the same efficiency as Class-B amplifier operation and that does not develop switching distortion due not only to transistors but also to diodes. This objective is achieved in accordance with a first aspect of the present invention by rapidly switching diodes by providing a current circuit for passing the switching current during the OFF time of the diodes.

As stated above, it is known to provide a Class-B, SEPP power amplifier circuit which passes a fixed idling current for effective power efficiency, but is biased to perform Class-B operation. However, in the case of the Class-B, SEPP power amplifier circuit, if idling currents are ignored, the transistors supplying power to the load are different during the positive half cycle of the input signal and the negative half cycle thereof and switching of transistors occurs corresponding to the switching between the positive and negative half cycles. Thus, switching distortion does occur due to a carrier storage effect, etc. of the transistors.

A further object of the present invention is to provide improved circuitry for eliminating the above shortcoming and to provide improved power amplifier circuitry that operates at virtually the same power efficiency as Class-B operation, prevents transistor switching that corresponds to the switching of the positive and negative half cycles of the input signal, and, at the same time, maintains all transistors in an ON-state until the high output power time even for a low impedance load so as not to produce switching distortion.

Other objects and advantages of this invention will be apparent from a reading of the following specification and claims taken with the drawing.

DETAILED DESCRIPTION OF PREFERRED EMBODIMENTS OF THE INVENTION

Figure 1:
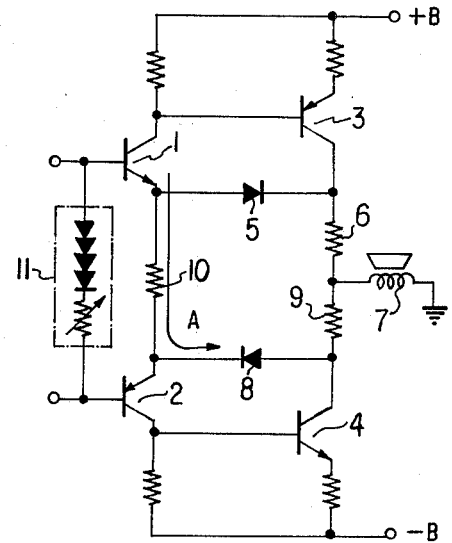
FIG. 1 is a circuit diagram of a conventional power amplifier circuit.

Reference should be made to the drawing where like reference numerals refer to like parts.

Figure 2:
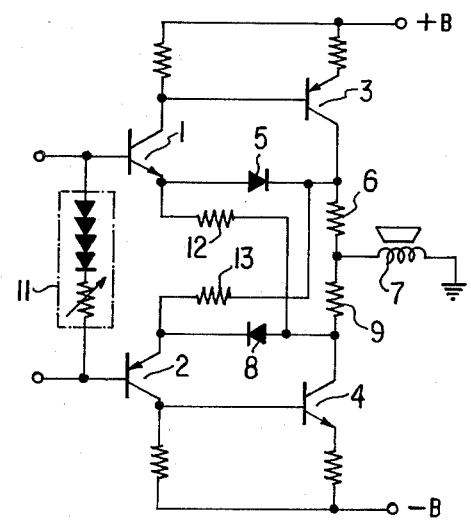
FIG. 2 is a circuit diagram of an illustrative power amplifier circuit in accordance with the invention.

Referring to FIG. 2, there is shown a power amplifier circuit in accordance with the invention including transistors 1, 2, 3, and 4, resistors 6 and 9, diodes 5 and 8, and bias circuit 11. Resistor 12 is connected between the emitter of transistor 1 and the collector of transistor 4 and resistor 13 between the emitter of transistor 2 and the collector of transistor 3 where the foregoing resistors replace resistor 10 of FIG. 1. +B and −B are the positive and negative power supply terminals.

In the power amplifier circuit of FIG. 2, currents to place transistors 1, 2, 3, and 4 in the ON-state are passed at the no-input signal levels and thus these transistors in the ON-state are set to perform the Class-B amplifying operation. When the positive half cycle of the input signal is applied, the input signal is amplified by transistors 1 and 3 and the emitter current of transistor 1 and the collector current of transistor 3 flow to load 7 through resistor 6 to supply power. Thus, diode 8 can no longer maintain the ON-state due to the voltage drop of resistor 6 and changes to the OFF-state. But, the voltages at both ends of resistor 13 do not change (0.6 V in this example), and transistors 2 and 4 maintain the ON-state without turning to the OFF-state. Since diode 8 shifts to the OFF-state—that is, switching occurs, the switching current of diode 8 flows in the reverse direction due to carrier storage effect as mentioned above. However, as the switching current of diode 8 flows the path of resistor 9, resistor 6, and resistor 13, diode 8 is switched quickly. Further, the switching current of diode 8 does not flow in transistor 1. Thus, switching distortion due to diode 8 switching does not occur. Needless to say, transistors 2 and 4 do not switch and switching distortion due to transistor switching does not occur either.

When the negative half cycle of the input signal is applied, the action is similar to that described as above, and a detailed explanation is omitted.

As described above, when the present invention is used, the transistors that supply power to the load during the positive and negative half cycles of the input signal switch almost the same as in Class-B operation. However, all transistors are in the ON-state at all times and do not switch OFF to ON, and thus, switching distortion due to transistor switching does not occur. At the time of diode switching, the switching speed of the diodes is increased by forming a current circuit for the switching current of each diode. Further, the switching current of the diodes does not flow to the transistors. Thus, no switching distortion occurs due to switching of the diodes either. The power efficiency is also about the same as in Class-B amplifying operation.

Figure 3:
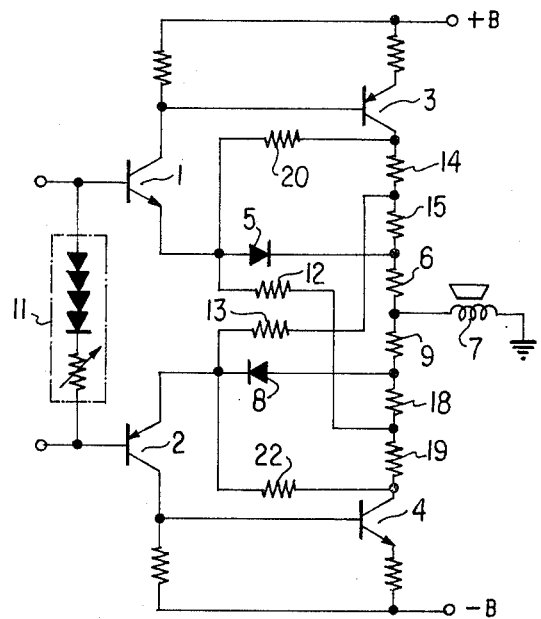
FIG. 3 is a circuit diagram of a further illustrative power amplifier circuit in accordance with the invention.

Referring to FIG. 3, there is shown another illustrative embodiment of the invention including a series circuit of diode 5, resistor 15 and resistor 14 is connected between the emitter of transistor 1 and the collector of transistor 3 to form an inverted Darlington connection between transistors 1 and 3. Further, the common connection point of diode 5 and resistor 15 is connected to load 7 through resistor 6. Similarly, a series circuit of diode 8, resistor 18, and resistor 19 is connected between the emitter of transistor 2 and the collector of transistor 4 to form an inverted Darlington connection between transistors 2 and 4. The common connection point between diode 8 and resistor 18 is connected to load 7 through resistor 9. A bias voltage of fixed value is impressed between the bases of transistors 1 and 2. The foregoing elements comprise a SEPP power amplifier circuit. Resistors 20 and 12 are respectively connected to the SEPP power amplifier circuit between the emitter of transistor 1 and the collector of transistor 3 and between the emitter of transistor 1 and the common connection point of resistors 18 and 19 respectively. Resistors 22 and 13 are respectively connected between the emitter of transistor 2 and the collector of transistor 4, and between the emitter of transistor 2 and the common connection point of resistors 14 and 15.

+B and −B are the respective positive and negative power supply terminals, and 11 is the bias circuit. Bias circuit 11 provides a fixed voltage bias between the bases of transistors 1 and 2. The bias voltage is set so that transistors 1 through 4 are turned on by the currents flowing through resistors 20, 12, 22 and 13. If idling current is ignored, the circuit performs Class-B amplifying operation at no-input signal level. Consequently, transistors 1, 2, 3, and 4 are in the ON-state at no-input signal level, and the current that flows through resistor 6 (or 9) is determined by the voltage obtained by subtracting the sum of the voltage between the base and emitter of transistor 1 (or 2), $V_{BE}$, and the ON-voltage of diode 5 (or 8) from the bias voltage between transistors 1 and 2.

When the positive half cycle of the input signal is applied, the input signal is amplified by transistors 1 and 3, and the emitter current of transistor 1 and the collector current of transistor 3 flow into load 7 through resistor 6 and supply power to load 7. The voltage drop across resistor 6 will then increase from the value resulting from the idling current until diode 8 no longer can maintain an ON-voltage so that this diode turns off. However, the potential at the common connection point of resistors 14 and 15 changes to the positive (+) side and the potential at the collector of transistor 4 changes to negative (−) side with respect to the potential at the common connection point of resistors 15 and 6. The emitter potential of transistor 2 rises due to the current flowing in the resistors 22 and 13, and transistor 2 is maintained in the ON-state as in transistor 4.

Figure 4:
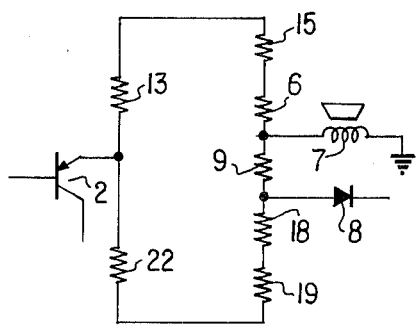
FIG. 4 is a simplified circuit diagram of a portion of FIG. 3 which is employed for explanatory purposes.

Now, when diode 8 is in the OFF-state, resistors 15, 6, 9, 18, 19, 22 and 13 comprise a bridge circuit as shown in FIG. 4. Since the currents flowing in resistors 9, 18, and 19 are very low, resistors 9, 18 and 19 may be ignored. The resulting bridge circuit includes resistors 15, 6, 22 and 13. If the resistance values of resistors 15, 6, 22 and 13 are denoted $R_{15}$, $R_6$, $R_{22}$, and $R_{13}$, and are chosen so that a relationship of $R_{15} \cdot R_{22} = R_6 \cdot R_{13}$ holds among the resistance values of the resistors, the bridge circuit balance. And, however, much the increase of current may be that flows in resistors 15 and 6, the voltage between the common connection point of these resistors and the emitter of transistor 6 is the same as the voltage between the common connection point of these resistors and the emitter of transistor 2 at no-input signal level and no change results. Consequently, transistor 2 becomes ON-state as in the condition when the same emitter current flows as the emitter current of transistor 2 at no-input signal level.

Also, even when the relationship of $R_{15} \cdot R_{22} = R_6 \cdot R_{13}$ does not hold among the resistance values of the resistors, transistor 2 is maintained in the ON-state as mentioned above. The emitter current of transistor 2 in this case has an ON-state value different from the emitter current of transistor 2 at the no-input signal level.

When the negative half cycle is applied, the operation is the same as above, and transistors 1 and 3 are maintained in the ON-state. A detailed explanation is omitted since it is the same as above. In this case, the input signal is amplified by transistors 2 and 4, and load 7 is supplied with power from transistors 2 and 4. And, resistors 9, 18, 20, and 12 (resistors 14, 15 and 6 are omitted because of very low current flow) comprise a bridge circuit, and the balanced condition is $R_9 \cdot R_{12} = R_{18} \cdot R_{20}$.

Next, in the cases of a bridge circuit consisting of resistors 14, 15, 6, 9, 18, 20, and 12 and a bridge circuit consisting of 15, 6, 9, 18, 19, 22 and 13 at no-input signal level, when the resistance values of resistors 14 and 19 are denoted as $R_{14}$ and $R_{19}$; and the resistances are set so that the relationships of $R_{12} \cdot (R_{14} + R_{15}) = R_{20} \cdot (R_6 + R_9 + R_{18})$ and
$R_{13} \cdot (R_{18} + R_{19}) = R_{22} \cdot (R_{15} + R_6 + R_9)$ hold, the bias current caused by resistors 20, 12, 22 and 13 is no longer influenced by the idling current of transistors 3 and 4, and bias stability is improved.

As explained above, when the embodiment of FIG. 3 is used, none of the transistors switch irrespective of the polarity of the input signal, the size of the load impedance, or the strength of the output power, but remain in the ON-state at all times and no switching distortion occurs. If the idling current of each transistor is ignored, the transistors that perform amplifying action and supply power to the load depending on the polarity of the input signal will be switched. The power efficiency is about the same as in the case of Class-B amplifying operation. Additional favorable effects include stability of bias.

Figure 5:
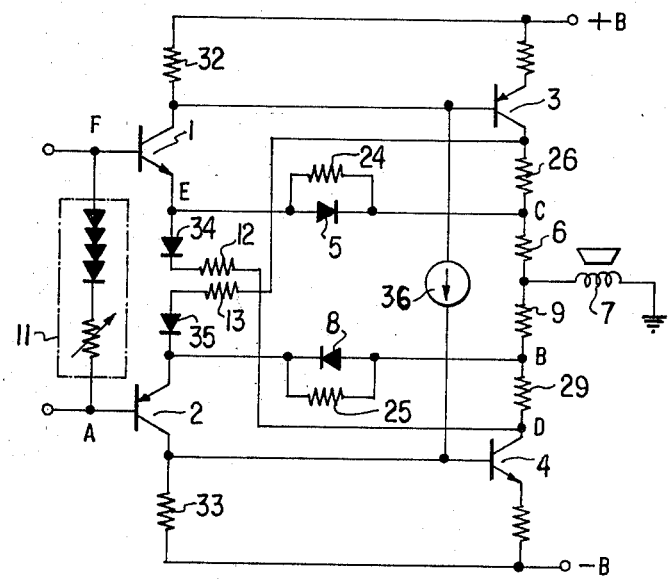
FIG. 5 is a circuit diagram of a further illustrative power amplifier circuit in accordance with the invention.

Referring to FIG. 5, there is shown another illustrative embodiment of the invention including a resistor 26 serially connected to the parallel circuit of diode 5 and resistor 24. The latter circuit is connected between the emitter of transistor 1 and the collector of transistor 3 to form an inverted Darlington connection between transistors 1 and 3. The common connection point C between diode 5 and resistor 26 is connected to load 7 through resistor 6. Similarly, a resistor 29 is serially connected to a parallel circuit of diode 8 and resistor 25 where the latter circuit is connected between the emitter of transistor 2 and the collector of transistor 4 to form an inverted Darlington connection between transistors 2 and 4. The common connection point B between diode 8 and resistor 29 is connected to load 7 through resistor 9. The SEPP power amplifier circuit includes the foregoing elements. In addition, a series circuit of diode 34 and resistor 12 is connected to the SEPP power amplifier circuit between the emitter of transistor 1 and the collector point D of transistor 4 as is a series circuit of diode 35 and resistor 13 between the collector of transistor 3 and the emitter of transistor 2.

+B and −B are positive and negative power supply terminals; and 34 is a constant current circuit that is connected between the bases of transistors 3 and 4 which passes a bias current to these bases. Bias circuit 11 is set such that it provides a fixed bias voltage to the bases of transistors 1 and 2, passes a set idling current at no-input signal level, and changes transistors 1–4 to the ON-state. The power amplifier circuit operates Class-B. The constant current circuit 36 causes transistors 3 and 4 to be in the ON-state even when the idling currents of transistors 1 and 2 are set low.

Now, when the negative half cycle of the input signal is applied to the power amplifier circuit, the collector currents of transistors 2 and 4 increase and supply power to load 7. As the input signal increases, the collector currents of transistors 2 and 4 increase, and the emitter current of transistor 2 flows into load 7 through resistor 9 and diode 8, and the collector current of transistor 4, through resistors 9 and 29. At this time, in spite of the increase in the emitter current of transistor 2, the voltage between the base and emitter, $V_{BE}$, of transistor 2 and the voltage at both ends of diode 8 practically show no change. Thus, the potential of point B corresponding to the base point A of transistor 2 does not change.

Also, depending upon the collector current of transistor 4, the potentials of point C and point D change to positive (+) side and to negative (−) side respectively with point B as the center. Consequently, the voltage between point C and emitter point E of transistor 1 is no longer maintained at the 0.6 V required to maintain diode 5 in the ON-state so that this diode changes to a cut-off state. When the input signal increases and diode 5 assumes the cut-off state, if diode 34 and resistor 12 are ignored at this time, the potential of the emitter point E of transistor 1 rises and changes transistor 1 in the OFF-direction. However, due to the presence of diode 34 and resistor 12, the current flowing through resistor 12 increases, the emitter potential of transistor 1 drops, and transistor 1 is maintained in the ON-state.

Figure 6:
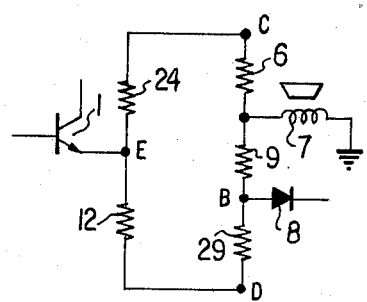
FIG. 6 is a simplified circuit diagram of a portion of FIG. 5 which is employed for explanatory purposes.

Now, when diode 3 assumes the cut-off state, resistors 24, 6, 29, 9, and 12 comprise a bridge circuit as shown in FIG. 6. Since the current flowing in resistor 6 is extremely low, resistor 6 may be ignored. The resulting bridge circuit consists of resistors 24, 29, 9, and 12.

If the resistance values of resistors 24, 26, 6, 25, 29, 9, 12, and 13 are denoted as $R_{24}$, $R_{26}$, $R_6$, $R_{25}$, $R_{29}$, $R_9$, $R_{12}$, and $R_{13}$ and the resistance values $R_{24}$, $R_{29}$, $R_9$, and $R_{12}$ are set to be: $R_{24} \cdot R_{29} = R_9 \cdot R_{12}$, the bridge circuit becomes balanced however much the increase of current may be that flows in resistors 29 and 9. The voltage between point B and point E is the same as the voltage between point B and point E at no-input signal level and no change results. Consequently, transistor 1 does not turn off, but stays in the ON-state in the condition when the same emitter current flows as the emitter current of transistor 1 under the nosignal condition.

Also, even when the above relationship of $R_{24} \cdot R_{29} = R_9 \cdot R_{12}$ does not exist, the emitter potential of transistor 1 drops as mentioned above, and transistor 1 becomes ON-state. In this case, however, the emitter current of transistor 1 becomes ON-state with a different value from the emitter current of transistor 1 at the no-input signal level. And, transistor 3 is also in the ON-state.

When an input signal of a positive half cycle is applied, the operation is the same as above, and a detailed explanation is omitted. However, in this case, load 7 power is supplied from transistors 1 and 3, and the balanced condition is $R_{26} \cdot R_{25} = R_6 \cdot R_{13}$. If the idling current of transistors 1 and 2 at no-input signal level is set at a large value, the constant current circuit 34 and resistors 32 and 33 may be omitted. Also, diodes 34 and 35 are connected to reduce the current flowing in resistors 12 and 13 at the no-input signal level, and they may be omitted.

Furthermore, the same action as above is obtained when the connection points of the parallel circuit of diode 5 and resistor 24 are connected to the collector of transistor 3, instead of point C, using only resistor 24. Further, the connection points of the parallel circuit of diode 8 and resistor 25 may be connected to the collector of transistor 4, instead of point B, using only resistor 25.

As explained above, when this embodiment of the invention is used, some of the transistors switch irrespective of the polarity of the input signal, the size of the load impedance, or the strength of the output power, and no switching distortion occurs. When the idling current of each transistor is ignored, the transistors that supply power to the load depending on the polarity of the input signal are switched. Further, the power efficiency is also about the same as in the case of Class-B amplifier operation.

It is to be understood that the above detailed description of the various embodiments of the invention is provided by way of example only. Various details of design and construction may be modified without departing from the true spirit and scope of the invention as set forth in the appended claims.

What is claimed is:
1. A singled-ended, push-pull, power amplifier circuit comprising
 a first inverted Darlington circuit including a first transistor, a second transistor and a first diode connected between the emitter of the first transistor and the collector of the second transistor,
 a load, a first resistor, the collector of the second transistor being connected to the load through the first resistor, a second inverted Darlington circuit including a third transistor, a fourth transistor and a second diode connected between the emitter of the third transistor and the collector of the fourth transistor, a second resistor, the collector of the fourth transistor being connected to the load through the second resistor, a bias voltage source for applying a bias voltage of fixed value between the bases of the first and the third transistors, a third resistor connected between the emitter of the first transistor and the collector of the fourth transistor, and a fourth resistor connected between the collector of the second transistor and the emitter of the third transistor.

2. A power amplifier circuit as in claim 1 where said first inverted Darlington circuit between the first and second transistors includes a series circuit of the first diode, a fifth and a sixth resistor connected between the emitter of the first transistor and the collector of the second transistor, the common connection point between the first diode and the fifth resistor being connected to the load through said first receiver, where said second inverted Darlington circuit between the third and fourth transistors includes a series circuit of the second diode, a seventh and an eighth resistor connected between the emitter of the third transistor and the collector of the fourth transistor, the common connection point of the second diode and the seventh resistor being connected to the load through said second resistor, and where the power amplifier circuit includes a ninth resistor connected between the emitter of the first transistor and the collector of the second transistor, a tenth resistor connected between the emitter of the third transistor and the collector of the fourth transistor, said third resistor being connected between the common connection point of the seventh resistor and the eighth resistor and the emitter of the first transistor and said fourth resistor being connected between the common connection point of the fifth resistor and the sixth resistor and the emitter of the third transistor.

3. A power amplifier as in claim 2 where the product of the resistances of the fifth and tenth resistors substantially equals that of the first and fourth transistors and where the product of the resistances of the second and third resistors substantially equals that of the seventh and ninth resistors.

4. A power amplifier circuit as in claim 1 where the collector of the second transistor is connected to the load through a series circuit of a fifth resistor and said first resistor, the first diode is connected between the emitter of the first transistor and the common connection point of the first and fifth resistors, a sixth resistor is connected between the emitter of the first transistor and the collector of the second transistor to form said first inverted Darlington circuit, the collector of the fourth transistor is connected to the load through the series circuit of a seventh resistor and said second resistor, the second diode is connected between the emitter of the third transistor and the common connection point of the second and the seventh resistors, an eighth resistor is connected between the emitter of the third transistor and the collector of the fourth transistor to form said second inverted Darlington circuit.

5. A power amplifier circuit as in claim 4 where the product of the resistances of the sixth and seventh resistors substantially equals that of the second and third resistors and the product of the resistances of the fifth and eighth resistors substantially equals that of the first and fourth resistors.

* * * * *